United States Patent [19] [11] 4,062,315

Sickmen [45] Dec. 13, 1977

[54] ADJUSTABLE LENGTH UNIVERSAL TUNING KNOB FOR T.V. RECEIVER

[76] Inventor: Robert C. Sickmen, 2432 E. Gate Drive, Silver Spring, Md. 20902

[21] Appl. No.: 665,911

[22] Filed: Mar. 11, 1976

[51] Int. Cl.[2] .......... H03J 1/02

[52] U.S. Cl. .......... 116/124.2 A; 116/DIG. 29

[58] Field of Search .......... 116/124.2 R, 124.2 A, 116/124 L, 124.1 R, 133, DIG. 29, DIG. 31; 334/86-87; 285/4; 73/322

[56] References Cited

U.S. PATENT DOCUMENTS

| | | | |
|---|---|---|---|
| 2,659,336 | 11/1953 | Insul | 116/DIG. 29 |
| 3,393,657 | 1/1964 | Fubunishi | 116/DIG. 29 |
| 3,517,638 | 6/1970 | Kern | 116/124.2 R |
| 3,691,839 | 9/1972 | Lasher | 73/322 |
| 3,831,549 | 8/1974 | Parsons | 116/124.1 R |
| 3,842,683 | 10/1974 | Valdettaro | 116/124.2 R X |
| 3,902,375 | 9/1975 | Herrick et al. | 116/124.1 R |
| 3,908,208 | 9/1975 | McIlroy | 285/4 X |

*Primary Examiner*—Daniel M. Yasich
*Attorney, Agent, or Firm*—Sixbey, Bradford & Leedom

[57] ABSTRACT

A universal television tuner knob is comprised of four simple readily assembled parts only one of which must be made of different sizes; the parts comprising a tuning shaft engageable sleeve, a channel indicator disc adapted to be mounted on said sleeve, finger manipulatable means formed integrally with the sleeve and means carried on said sleeve to engage the channel indicating disc in any one of thirteen angular positions whereby the disc may be positioned relative to the tuner shaft so that the indicator disc will properly indicate the channel on which the tuner is fixed.

1 Claim, 6 Drawing Figures

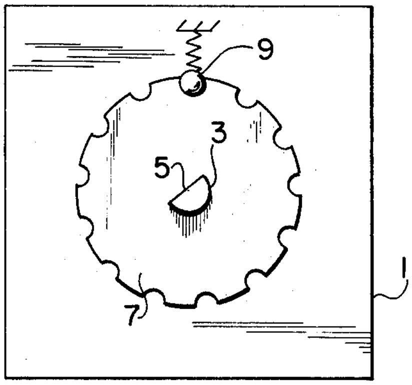
FIG. 1
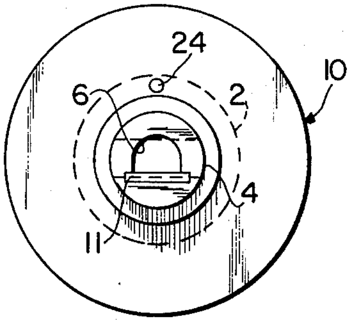
FIG. 6
FIG. 2
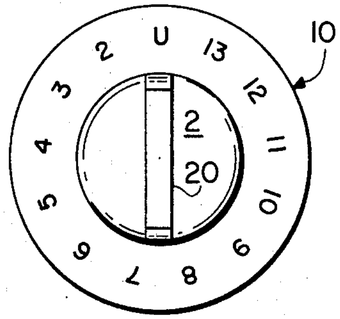
FIG. 3
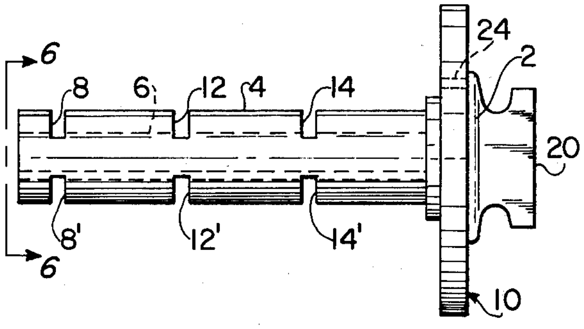
FIG. 4
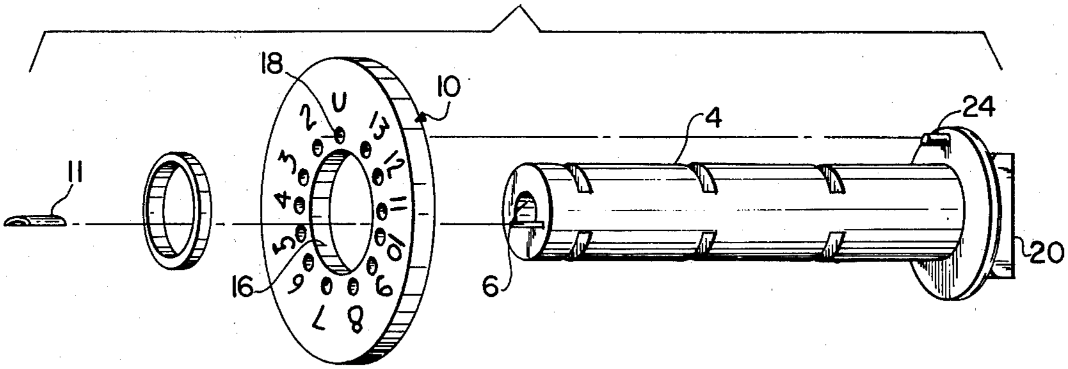
FIG. 5
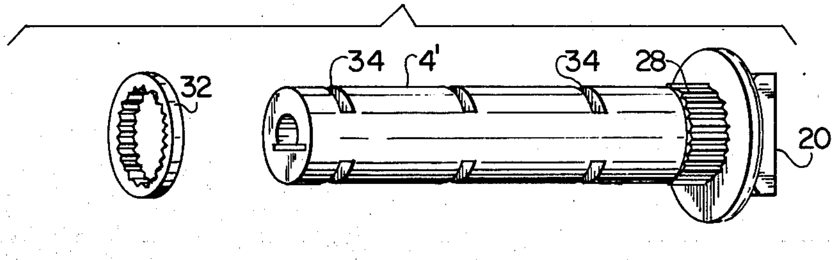

ADJUSTABLE LENGTH UNIVERSAL TUNING KNOB FOR T.V. RECEIVER

BACKGROUND OF THE INVENTION

In today's market place there is virtually an endless variety and makes of the usual home television sets. As a result of this, and the fact there is no standardization of the sizes and shapes of the control knobs used on television sets, there are an almost infinate variety of control knobs used throughout the industry.

The lack of standardization is no more evident than in the case of television tuners or channel selectors, for not only do control shaft lengths vary, but the position of the flat land which the control knob engages for rotation varys on the shaft so that its angular position, when a given channel is selected may and does vary making it impossible to determine, from the channel indicator on the knob, what channel has been tuned unless the channel indicator and knob have been precisely designed for use with a given tuner.

FIG. 1 schematically illustrates the mentioned problem. As shown, the tuner 1 is operated by a shaft 3 having a flat land 5, or other discontinuity which is adapted to engage a similar land or discontinuity located in the bore of a sleeve of an operator knob (not shown) which turns the shaft 3. Also connected to the shaft 3 is some form of detent means, illustrated as a detent wheel 7 and a spring biased detent ball 9 so that as the tuner is rotated from one angular position to another it is releasably locked in the selected angular position. The control knob which is originally furnished with the tuner, whatever make or brand, is always so designed that when it is installed on shaft 3 the channel indicators will align with the detents and also will align with the tuner so as to indicate to which channel the tuner is set. Thus, the tuner and knob are specifically matched to each other.

Unfortunately, it is a fact of life that T.V. tuner knobs do get broken and lost. A conservative estimate would be that, after several years, at least one out of five television sets end up with a broken or lost tuner control. When consideration is given to the number of sets sold and in use in the world, it becomes immediately evident that the market for replacement television tuner knobs is substantial. However, due to the lack of standardization for such knobs, the only sources for such replacements is the individual manufacturer of any given brand of television and even here it is necessary to order replacements for individual sets because every manufacturer markets a wide variety of styles and models of sets most of which do not share common tuner control knobs or even tuners.

The brunt of the lack of availability of replacement control knobs for television tuners is, as is often the case, borne by the consumer who when faced with the problem of a lost or broken tuner knob must order the knob directly from the manufacturer of the particular set or must attempt to obtain a replacement from a distributor of the particular product or resort to the usual T.V. repair service in an effort to correct the situaition.

Since it is impossible for distributors or television repair shops to stock every knob for every television set, the end result is that some make-shift substitute knob is offered to the consumer which may not fit properly or properly identify the channel selection of the tuner or, alternatively the unfortunate consumer must wait for eons of days until the proper knob can be ordered and obtained from the manufacturer of the particular brand of set in question. Even then, more often than not, the part is not available for one reason or another, so a make-shift substitute is the end result.

PRIOR ART

The aforesaid problem of replacement of worn, broken or lost television tuner knobs has long been recognized and various attempts have been made to alleviate the situation. For example, Meyers U.S. Pat. No. 1,456,644 shows an adjustable knob for electrical controls having a positionable indicator plate to permit the function of the control at any given position to be properly indicated. Also, Fox U.S. Pat. No. 3,769,933 discloses another approach to the problem. See also Yamura U.S. Pat. No. 3,750,619 and Parsons U.S. Pat. No. 3,831,549 specifically dealing with tuning knobs for T.V. tuners and having provisions for changeable indicia.

As far as is known, none of the above tuner control knobs are used successfully in the industry as a universal replacement tuner control knob. There are many reasons for this. First, most of the noted devices are expensive. Second, all of the devices require a multiplicity of separate and often hard to assemble parts. Thirdly, none of the patented devices provides a truly universal knob for T.V. tuners.

Accordingly, a principle object of this invention is to provide a truly universal, minimal part readily stocked, inexpensive replacement knob primarily for television tuners.

THE INVENTION

The details of the universal control knob will become readily apparent from an inspection of the appended drawings, wherein:

FIG. 1 is a schematic view of a television tuner and shaft;

FIG. 2 is a face or front view of a universal tuner control knob in accordance with the invention;

FIG. 3 is a side view of the knob shown in FIG. 1;

FIG. 4 is an exploded perspective view showing the parts of the control knob;

FIG. 5 is a view similar to FIG. 4 but showing a modified version of the tuner control knob parts; and FIG. 6 is an end view, somewhat enlarged, taken along the line 6—6 of FIG. 3.

As shown in FIG. 2 the control knob comprises a circular indicator disc 10, having embossed, printed or engraved on its front face, the usual television channel identification numerals 2 through 13 plus the letter "U" for ultra high frequency positioning of the tuner.

The center of the assembled knob includes an outwardly projecting tongue 20 which may readily be engaged by the fingers so that the knob may be rotated in either direction. The tongue 20, need not be fanciful as shown in the drawings but could simply be in the form of an outwardly projecting bar which can be grasped by the fingers. In any event, the tongue 20, as shown in particular in FIG. 2, is formed integrally with a base plate 2 which is of smaller diameter and bears against the inscribed face of the indicator disc 10.

As shown in FIGS. 3 and 4 the base plate 2 is attached to a sleeve 4 which extends axially outwardly from the base plate from the opposite face thereof to that to which the tongue is attached.

Sleeve 4 is provided, as shown in FIGS. 4 and 6, in particular, with a generally hat shaped bore 6 throughout its axial length. The configuration of the bore 6 is purely conventional and is such that a spring lock 11, see FIG. 4, in the form of a slightly bowed plate may be inserted in the brim or widest portion of the bore 6. The lock 11 thus bears against the land portion 5, see FIG. 1, of the tuner shaft 3 to frictionally lock the tuner knob against rotation on the shaft and also to stop the knob against axial sliding on the tuner shaft.

Preferably, the sleeve 4 is provided with pairs of diametrically aligned inwardly extending slots 8,8', 12,12', and 14,14' at spaced points along its length as clearly shown in FIGS. 3 and 4. The purpose of these slots is to provide points of weakness along the sleeve for purposes as will become apparent hereinafter.

Also projecting from the base plate 2 and spaced outwardly from and parallel to the shaft 4 is a small pin or projection 24. The purpose of this pin will also become apparent as the description proceeds.

As is apparent from further consideration of FIG. 3, in conjunction with FIG. 4, the indicator disc 10 is provided with a central aperture 16 of such size as to readily pass over the sleeve 4. Surrounding the central aperture 16 are a plurality of smaller apertures 18. The smaller apertures 18 surround the shaft receiving aperture 16 at precisely equal angular spaces that align with the individual numerals inscribed on the face of the indicator disc. Thus, there are 13 such equally spaced smaller apertures 18 lying on a common circumference surrounding the central aperture 16. The position of these small apertures is such that when the indicator dial is placed on sleeve 4 and slid into abutment with base plate 2, any one of the apertures may be selectively aligned with and receive the pin 24 so that the indicator disc is locked against rotation relative to the base plate 2 and, of course the knob 20.

Once the indicator disc is in position on the sleeve, it is retained against axial movement by simply slipping an elastomeric ring, such as an O-ring or the like, on the sleeve 4 and sliding it there along into abutment with the indicator disc 10.

It is believed that it is now apparent how the universal tuner control knob is applied to a tuner. First, the set will be turned on and the channel to which is tuned will be visually identified. The indicator disc is then slid on sleeve 4 and the sleeve is then aligned to its proper position to fit the tuner shaft. The indicator disc is then rotated on the sleeve until the numeral corresponding to the channel to which the set is tuned is in the uppermost position or aligns with some form of identification mark on the set itself. The disc is then pushed against the base plate and the proper one of the smaller apertures 18 engages and is locked to pin 24 with the numerals on the indicator disc in proper position to indicate whatever channel may be subsequently selected by turning the tuner. The O-ring is slipped over the sleeve into abutment with the indicator plate.

Again the assembly is re-inserted on the tuner shaft and pushed axially thereon as far as possible. In the event that sleeve 4 is so long as to make the indicator disc be spaced too far from the front of the T.V. set, the assembly is removed and the sleeve can readily be broken off at one of the weakened points to shorten the sleeve 4 to the proper length.

When the proper length is obtained, the spring clip 11 is inserted into bore 16 as shown in FIG. 6 and the assembly is now pushed onto the tuner shaft and the job is done.

The provision of the break off points makes it a simple matter to obtain the correct length of sleeve 4. It has been determined that in almost every tuner the length of the tuner shaft is either ¾, 1 or 1½ inches. Thus, the so called weakened areas of the shaft are positioned ¾, 1 and 1½ inches from the base plate and generally these three break off points will satisfy every requirement that the replacement assembly must meet.

A further modification of the device is shown in FIG. 5. In this case instead of a pin 24, the hilt of the sleeve adjacent the base and/or the face of the base plate against which the indicator disc abuts may be provided with serrations 28. The center aperture of the indicator disc (not shown) is provided with mating serrations so as to engage the serrations on the shaft 4' or the base plate 2 or both to lock the disc against rotation relative to the shaft. In this version a spring washer 32 having a serrated center opening could be substituted for the O-ring.

Further in the FIG. 5 modification the shaft 4' can be provided with annular grooves 34 to define the shaft break off points. If these grooves are relatively shallow they may serve as simply demarcation points where the shaft 4 may be cut instead of simply broken off to provide the proper length. On the other hand if grooves 34 are fairly deep then they will define lines of weakness at which places the shaft may be readily broken off as in the case of the FIG. 4 structure.

Having described the preferred embodiment for carrying out the invention, various modifications and changes may occur to those skilled in the art, which may fall within the spirit and scope of the appended claims, wherein What is claimed is:

1. A control knob including means for indicating the position of a control shaft such as a television tuner, said knob comprising a sleeve and a base plate assembly including a base plate, said base plate being non-rotatably attached to said sleeve and concentric therewith; an indicator disc having position designating means inscribed thereon, said disc having a central aperture adapted to receive and slide along said sleeve to permit said disc to abut said base plate; a finger operable tongue attached to said base plate and projecting outwardly from said base plate in a direction opposite to that in which said sleeve projects; a projection extending outwardly from said base plate in the same direction as and parallel to said sleeve, said indicator disc having a plurality of angularly spaced apertures, any one of which is selectively engageable with said projection, said projection and said apertures constituting means for interengaging said indicator disc and said base plate only when said disc abuts against the base plate whereby said indicator disc may be rotated to a selected position with respect to said sleeve prior to its abutment with said base plate; and means engageable with said sleeve to retain said disc in abutment with said base plate, and said sleeve having weakened areas spaced axially therealong to facilitate breaking off and removal of portions thereof to selectively adjust the length thereof.

* * * * *